US006937684B2

(12) United States Patent
Tzou et al.

(10) Patent No.: US 6,937,684 B2
(45) Date of Patent: Aug. 30, 2005

(54) PHASE DISCRIMINATOR WITH A PHASE COMPENSATION CIRCUIT

(75) Inventors: Ching-Kae Tzou, Hsin-Chu Hsien (TW); Yung Ching Lin, Hsin-chu (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 645 days.

(21) Appl. No.: 09/970,254

(22) Filed: Oct. 2, 2001

(65) Prior Publication Data

US 2003/0063700 A1 Apr. 3, 2003

(51) Int. Cl.[7] .................................................. H03D 3/24

(52) U.S. Cl. ......................... 375/376; 329/50; 375/341; 375/224; 375/147; 375/329

(58) Field of Search .................. 329/308, 50; 375/130, 375/285, 137, 341, 224, 147, 329

(56) References Cited

U.S. PATENT DOCUMENTS

| | | | | | |
|---|---|---|---|---|---|
| 4,439,737 | A | * | 3/1984 | Mattei | 329/308 |
| 4,660,216 | A | * | 4/1987 | Claasen et al. | 375/285 |
| 4,862,098 | A | * | 8/1989 | Yassa et al. | 329/358 |
| 5,136,611 | A | * | 8/1992 | Kirimoto et al. | 375/130 |
| 6,549,561 | B2 | * | 4/2003 | Crawford | 375/137 |
| 2003/0016737 | A1 | * | 1/2003 | Wu et al. | 375/224 |

OTHER PUBLICATIONS

"SACHEM, a Versatile DMT–Based Modem Transceiver for ADSL"□□L. Kiss, K. Adriaensen, C. Gendarme, E. Hanssens, M. Huysmans, F. Van Beylen, and H. Van De Weghe□□IEEE Journal of Solid–State Circuits, vol. 34, No. 7, Jul. 1999 pp. 1001–1009.*

"Timing Recovery For Echo–Cancelled Discrete Multitone Systems"□□Minnie Ho and John M. Cioffi□□IEE International Conference on Communications SUPERCOMM/ICC'94, vol. 1, 1994, pp. 307–310.*

* cited by examiner

*Primary Examiner*—Stephen Chin

(57) ABSTRACT

A differential phase discriminator includes a phase compensation circuit to compensate for timing drift and error for recovering timing information in a digital phase lock loop. The differential phase discriminator uses a differential phase detector to compute the phase difference of two consecutive frequency domain signal samples. The phase compensation circuit determines a phase correction term by computing the difference between the absolute values of the real and imaginary parts of a frequency domain signal sample. A weighting factor is computed by adjusting the sum of the absolute values of the real and imaginary parts of the frequency domain signal sample with a ratio adjustment factor. A phase compensation value is then computed by multiplying the phase correction term by the weighting factor. The phase compensation value is added to the uncorrected output of the differential phase detector.

6 Claims, 4 Drawing Sheets

PHASE DISCRIMINATOR WITH A PHASE COMPENSATION CIRCUIT

FIELD OF THE INVENTION

The present invention generally relates to a timing recovery circuit in an asymmetric digital subscriber line (ADSL) system, and more specifically to a phase discriminator having a phase compensation circuit for a digital-phase-lock-loop (DPLL) to locally recover the clock frequency information delivered from a central office.

BACKGROUND OF THE INVENTION

In ADSL standards such as T1E1.4 and G.DMT, the 4-QAM modulation scheme is adopted to modulate a pilot tone for carrying timing information from a central office (ATU-C) site to a remote terminal (ATU-R) site, or vice versa. In order to synchronize the ATU-R with ATU-C, for example, ATU-R should lock the carrier's frequency and/or phase in the pilot tone.

A simple approach for an ATU-R site to recovering the clock frequency information delivered by an ATU-C site uses a DPLL with a discriminator as the phase detector to find the phase difference of two consecutive symbols without the need of a complex hardware. FIG. 1 shows the block diagram of such a typical DPLL circuit 10 that comprises a differential phase discriminator 100, a low pass filter, and a voltage controlled crystal oscillator 43. In an ideal case, if the timing is perfectly recovered, the phase difference will gradually decrease to zero. In a practical implementation, however, noises and interference corrupt the clock information carried by the pilot tone. Thus, perfect timing recovery is impossible.

Timing shift compensation is necessary in a differential DPLL as illustrated in FIG. 1 since the quantization error introduced by fix-point operations is one of the noise sources that affect the loop timing recovery. This quantization error introduces timing drift between ATU-C and ATU-R which is not detected by the differential DPLL circuit. After a long period of communication time, the local timing drifts far away from the correct loop timing. In addition, inter-frame interference occurs and no mechanism can correct the timing error. Eventually, link re-initialization or fast retrain may be necessary to reset the link.

In an ADSL system, a 4-QAM signal whose constellation fixes at, for example, (+1, +1) on the two-dimensional signal plane as illustrated in FIG. 2 modulates a pilot tone. Before the ATU-R local clock locking to correct loop timing, the pilot tone phase may rotate. As illustrated in FIGS. 2A and 2B, when the timing is close to synchronization, the phase difference is near zero. However, quantization error due to fixed point numerical operations results in slight phase rotation. The small phase difference can not be detected by the differential phase discriminator 100. The frequency of the voltage controlled crystal oscillator 43 is no longer adjusted in that the differential phase discriminator 100 output is zero. After a period of time, the small phase difference accumulates gradually and results in synchronization failure between ATU-C and ATU-R.

To achieve truly coherent demodulation in conventional approaches, a sample shift operation may be used to compensate for the timing drift as proposed by Minnie Ho and John M. Cioffi in a paper titled "Timing Recovery for Echo-Cancelled Discrete Multitone Systems" in Conference Record of IEEE International Conference on Communications SUPERCOMM/ICC'94, Vol. 1, pp. 307~310, 1994.

The same idea has also been utilized by L. Kiss, et. al., in a paper titled "SACHEM, a Versatile DMT-Based Modem Transceiver for ADSL" in IEEE Journal of Solid-State Circuits, Vol. 34, No. 7, July 1999. This sample shift in time domain introduces a phase jump into each tone of the ADSL receiving system in frequency domain, and this phase jump is proportional to each tone's frequency. Therefore, a phase compensation circuit is needed to properly take care of different phase jumps in tones.

In other approaches, on the other hand, a complicated coherent demodulation method is adopted to extract phase information directly from the pilot tone. The received pilot tone either has to be normalized first and then compared with the expected 4-QAM signal constellations, or its phase angle has to be obtained by an arc-tangent operation. These approaches add considerable hardware cost because both normalization and arc-tangent require relatively complicated numerical operations as compared with other parts in a DPLL circuit.

SUMMARY OF THE INVENTION

This invention has been made to overcome the above mentioned drawbacks of conventional timing recovery circuits using a DPLL. The primary object of this invention is to provide a simple phase compensation circuit for a phase discriminator to compensate for timing drift and error. The simple circuit generates a phase compensation value to be added to the uncorrected discriminator output and forces the received pilot tone signal to be close to the 4-QAM signal on the 2-D signal plane.

Accordingly, the phase discriminator of this invention comprises a conventional phase discriminator in parallel with a phase compensation circuit. Based on the quadrant in which a pilot tone is located in the 2-D signal plane, a phase correction term can be computed in the phase compensation circuit. A weighting factor defined and derived from the pilot tone is also calculated to adjust relative weighting between the phase correction term and the uncorrected output of the phase discriminator to form the phase corrected output. The phase discriminator of this invention provides a timing recovery circuit without a complicated phase calculation and compensation circuit to overcome the timing drift problem. Normalization or other numerical operation is also not necessary in the circuit and, thus, it greatly reduces the required hardware.

The foregoing and other objects, features, aspects and advantages of the present invention will become better understood from a careful reading of a detailed description provided herein below with appropriate reference to the accompanying drawings.

DETAILED DESCRIPTION OF THE INVENTION

In the conventional demodulation technology, the received signal may suffer from timing drift because of the frequency difference between the remote oscillator and the local oscillator. This timing drift makes it very difficult for coherent demodulation. By means of generating a phase compensation value to compensate for the deficiency of the conventional differential phase discriminator circuit, this invention adjusts the frequency of the local oscillator to achieve the goal of coherent modulation.

Figure 3:
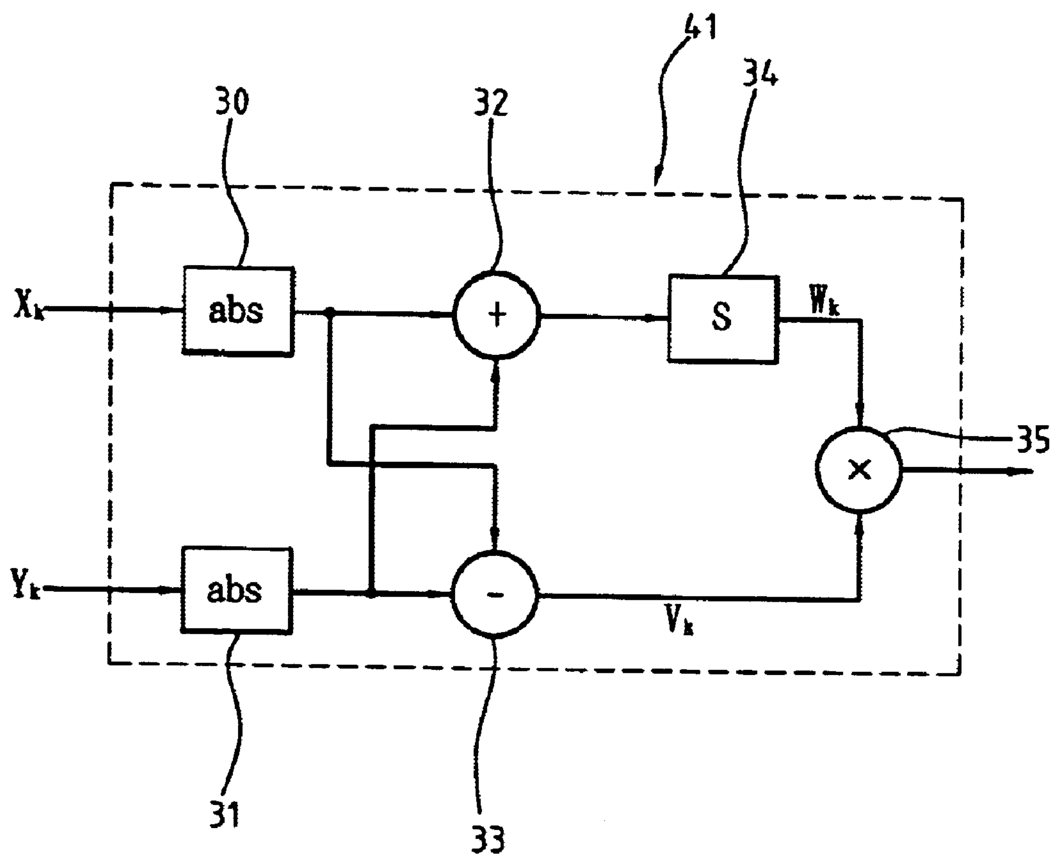
FIG. 3 shows a block diagram of the phase compensation circuit according to this invention.

With reference to FIG. 3, the phase compensation value of this invention is defined as the product of a phase correction term $V_k$ and a weighting factor $W_k$. The phase correction term $V_k$ is defined as $V_k = \text{abs}(Y_k) - \text{abs}(X_k)$ for a pilot tone sample located at the first or the third quadrant on the 2-D signal plane, and $V_k = \text{abs}(X_k) - \text{abs}(Y_k)$ for a pilot tone sample located at the second or the fourth quadrant on the 2-D signal plane, where abs(x) denotes the absolute value of the enclosed variable x, $X_k$ is the real part of a pilot tone sample in frequency domain at time epoch k, and $Y_k$ is its associated imaginary part.

The weighting factor $W_k$ is defined as:

$$W_k = (\text{abs}(X_k) + \text{abs}(Y_k)) * S,\ 0 \leqq S \leqq 1$$

where the ratio adjustment factor S is a value between 0 and 1. In practice, the optimal ratio adjustment factor is $2^{-n}$ in which the parameter n is chosen as a number greater than 0 but smaller than the number of bits required to represent the value of $[\text{abs}(X_k) + \text{abs}(Y_k)]$. The weighting factor by this definition can automatically take care of a large dynamic range caused by the loop attenuation in the received pilot tone that is not well compensated by an automatic-gain-control (AGC) circuit in the receiver. Other form of weighting factor is, of course, possible. For example, exact values of $\text{abs}(X_k)$ and $\text{abs}(Y_k)$ are not of concerns and only information of few most significant bits (MSBs) in these two terms is needed to compute the weighting factor $W_k$. In other words, the probable values of $\text{abs}(X_k)$ and $\text{abs}(Y_k)$ can be used as their exact values in the computation. Hence, significant hardware area can be reduced in the circuit. Although the weighting factor $W_k$ shown above has a scaling factor $2^{-n}$, it can be scaled down by other constant factor in general.

Figure 1:
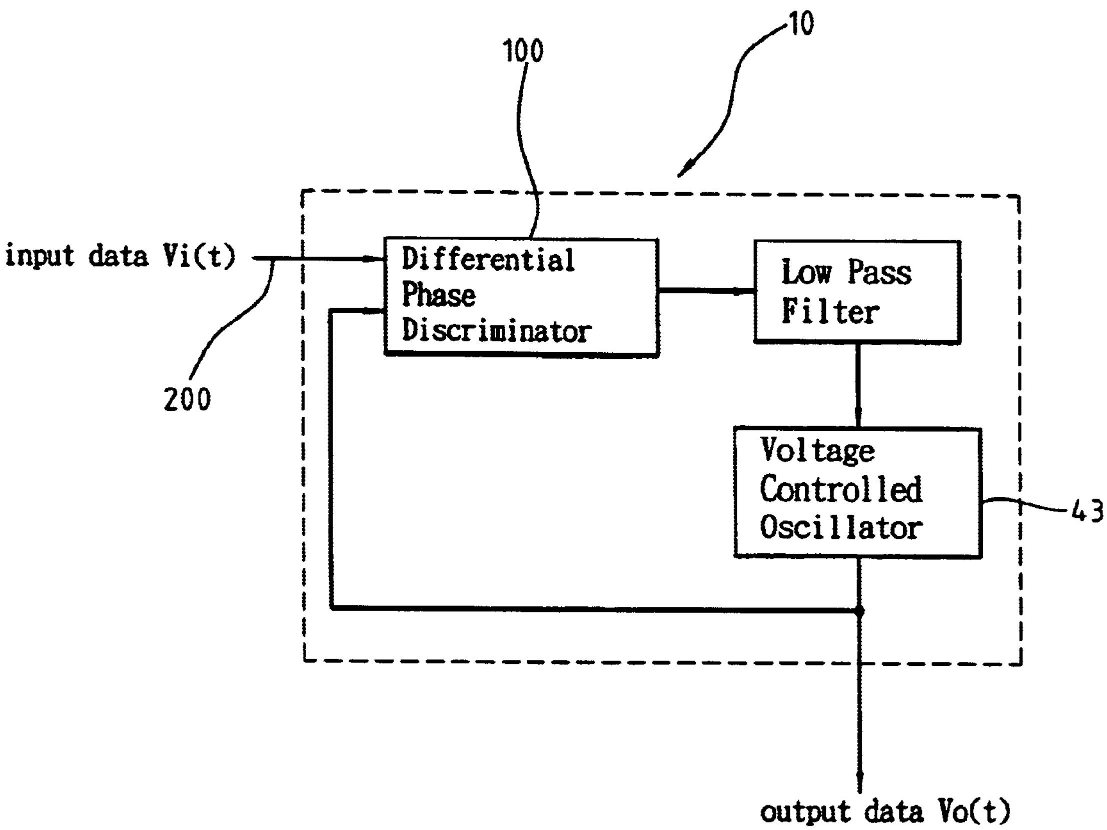
FIG. 1 is the block diagram of a typical DPLL circuit.
Figure 2A:
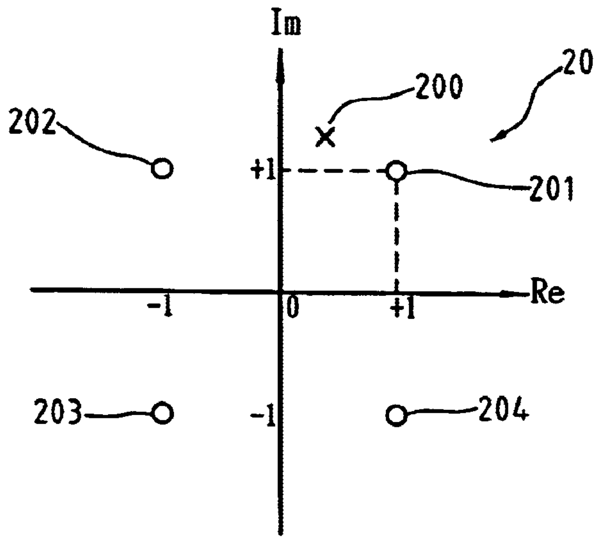
FIGS. 2A and 2B illustrate the 2-D signal plane of 4-QAM signal constellations and the phase rotation.
Figure 2B:
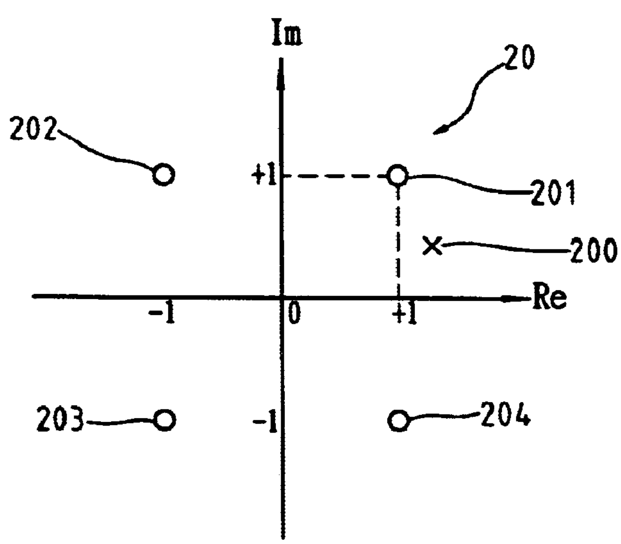

FIGS. 2A and 2B illustrate the 2-D signal plane of 4-QAM signal constellations and the phase rotation. There are four expected 4-QAM signals 201, 202, 203 and 204 in the four quadrants. As shown in FIGS. 2A and 2B, the received signal 200 has shifted away from the 4-QAM signal 201 located at (+1, +1) on the 2D signal plane 20. The received signal is the result of a phase shift. In FIG. 2A, the received signal 200 is located on the counter-clockwise direction of the 4-QAM signal 201. The phase correction term $V_k$ is defined as a positive value for increasing the frequency of the local oscillator so as to make the received signal 200 move near the 4-QAM signal 201. On the contrary, in FIG. 28 the received signal 200 is located on the clockwise direction of the 4-QAM signal 201. The phase correction term $V_k$ is defined as a negative value for decreasing the frequency of the local oscillator so as to make the received signal 200 move near the 4-QAM signal 201. Because the phase correction term $V_k$ is a relatively large value, it is necessary to multiply it with the weighting factor $W_k$ to control the converging speed of the phase correction.

As shown in FIG. 3, the block diagram of the phase compensation circuit 41 of this invention comprises a first absolute value computation unit 30 for computing the absolute value of $X_k$, a second absolute value computation unit 31 for computing the absolute value of $Y_k$, an adder 32 for adding the absolute value of $X_k$ and the absolute value of $Y_k$, and a subtractor 33 for computing the difference between the absolute of $X_k$ and the absolute value of $Y_k$ to generate the phase correction term $V_k$. The weighing factor $W_k$ is obtained by multiplying the ratio adjustment factor S with the output of the adder 32. A multiplier 35 is used to compute the phase compensation value which is the product of the phase correction term $V_k$ and the weighting factor $W_k$.

Figure 4:
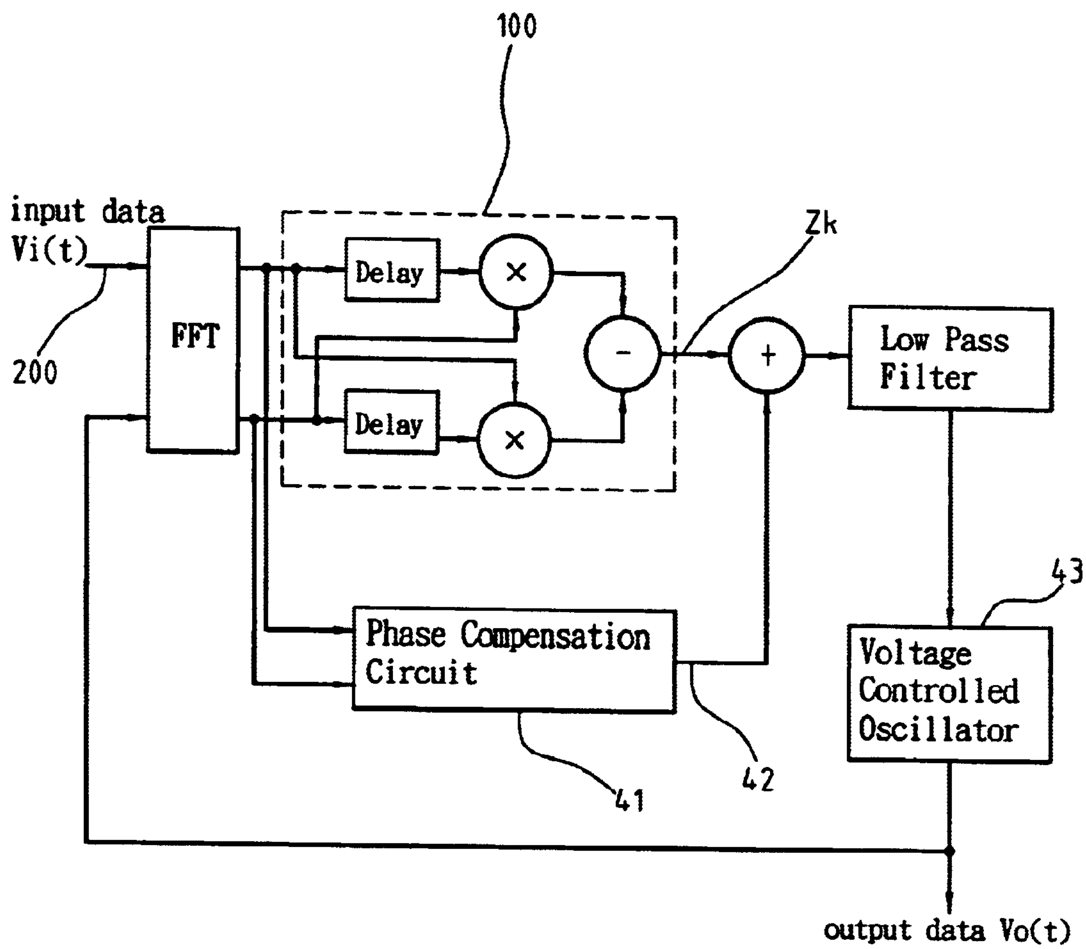
FIG. 4 shows an embodiment of the phase discriminator circuit according to this invention.

With reference to FIG. 4, the output $Z_k$ of a conventional differential phase discriminator 100 can be expressed as $$Z_k = Im[(X_k + jY_k)(X_{k-1} - jY_{k-1})]$$

where $X_k$ is real part of a pilot tone sample in frequency domain at time epoch k, and $Y_k$ is its associated imaginary part. Im[x] is an operation that takes the imaginary part of a variable x.

The phase discriminator circuit of this invention is shown in FIG. 4. In addition to a conventional phase discriminator circuit 100, it also comprises a phase compensation circuit 41. The output 42 of the phase compensation circuit 41 is used to correct the output of the conventional phase discriminator circuit 100 to obtain a phase corrected discriminator output. According to this invention, the phase compensation value 42 is added to $Z_k$. As illustrated in FIGS. 2A and 2B, the phase of the received signal is adjusted to the correct signal location by adding the phase compensation value to $Z_k$.

From the hardware point of view, it is easy to determine in which quadrant the pilot tone sample is. In addition, the weighting factor is used to scale the item $V_k$ before adding to the discriminator output $Z_k$ to adjust the relative weighting between $V_k$ and $Z_k$ in a DPLL circuit and increase the convergence controllability of this DPLL.

When the phase discriminator circuit as shown in FIG. 4 starts its operation, the phase difference between two consecutive pilot-tone symbols at the FFT output is very pronounced and the output $Z_k$ of the conventional phase discriminator 100 controls the voltage controlled oscillator 43 to synchronize ATU-C and ATU-R. When ATU-R achieves clock frequency synchronization with ATU-C, this phase difference (between consecutive pilot-tone symbols) and, therefore, $Z_k$ becomes small. The phase compensation value 42 of the phase compensation circuit 41 gradually dominates the control of the voltage control oscillator 43. Afterwards, the DPLL still tries to minimize the phase angle (not including the amplitude) difference between the received signal and the phase angle of a 4-QAM signal constellation due to the phase compensation value. The pilot tone eventually has a phase very close to one of the 4-QAM signal constellations on the 2-D signal plane at a steady state. Coherent demodulation is thus achieved at ATU-R.

Another benefit of the simple circuit of this invention is that it can be easily adapted to situations where a more complex QAM constellation is adopted in pilot tones to carry the timing information. The expected QAM signal is not necessarily restricted to a fixed point such as "00" of the 4-QAM signal constellation on a 2-D signal constellation plane as that defined for the pilot tone in ADSL standards. Any data carrying sub-channel modulated by the 4-QAM signal constellation illustrated in FIG. 2 at the FFT output can be fed into this circuit to extract timing information from the received signal stream. Thus, flexibility is greatly enhanced as compared with conventional approaches.

The circuit of this invention does not need a complicated phase calculation and compensation circuit to solve the timing drift problem. Normalization or other numerical operation is also not necessary in the circuit and, thus, the hardware of a timing recovery circuit is greatly reduced. It has been verified experimentally that perfect timing recovery as achieved in an ideal DPLL is possible and can be easily sustained by this simple circuit.

Although the present invention has been described with reference to the above circuit, it will be understood that the invention is not limited to the details described thereof. Various substitutions and modifications have been suggested in the foregoing description, and others will occur to those of ordinary skill in the art. For example, the circuit described above may be implemented by firmware instead of hardware device. Therefore, all such substitutions and modifications are intended to be embraced within the scope of the invention as defined in the appended claims.

What is claimed is:

1. A phase compensation circuit in a digital phase lock loop, comprising:

a first computation unit for computing the absolute value of the real part of a frequency domain signal sample;

a second computation unit for computing the absolute value of the imaginary part of said frequency domain signal sample;

an adder for computing the sum of the absolute value of the real part of said frequency domain signal sample and the absolute value of the imaginary part of said frequency domain signal sample;

a weighting circuit for multiplying the output of said adder with a ratio adjustment factor to generate a weighting factor;

a subtracter for computing the difference between the absolute value of the imaginary part of said frequency domain signal sample and the absolute value of the real part of said frequency domain signal sample to form a phase correction term; and a multiplier for multiplying said weighting factor with said phase correction term to form a phase compensation value.

2. The phase compensation circuit as claimed in claim 1, wherein the absolute value of the real part of said frequency domain signal sample computed by said first computation unit is a probable value and the absolute value of the imaginary part of said frequency domain signal sample computed by said second computation unit is a probable value.

3. The phase compensation circuit as claimed in claim 1, wherein said phase correction term is computed as the absolute value of the imaginary part of said frequency domain sample signal minus the absolute value of the real part of said frequency domain sample signal if said frequency domain sample signal is located in the first or the third quadrant on a 2-D signal plane, and computed as the absolute value of the real part of said frequency domain sample signal minus the absolute value of the imaginary part of said frequency domain sample signal if said frequency domain sample signal is located in the second or the fourth quadrants on a 2-D signal plane.

4. The phase compensation circuit as claimed in claim 1, wherein said ratio adjustment factor is a value between 0 and 1.

5. The phase compensation circuit as claimed in claim 4, wherein said ratio adjustment factor is $2^{-n}$ and n is a value greater than 0 but smaller than the number of bits required in representing the sum computed by said adder.

6. A differential phase discriminator circuit, comprising:

a differential phase discriminator having a differential phase output;

a phase compensation circuit comprising a first computation unit for computing the absolute value of the real part of a frequency domain signal sample; a second computation unit for computing the absolute value of the imaginary part of said frequency domain signal sample; a first adder for computing the sum of the absolute value of the real part of said frequency domain signal sample and the absolute value of the imaginary part of said frequency domain signal sample; a weighting circuit for multiplying the output of said adder with a ratio adjustment factor to generate a weighting factor; a subtractor for computing the difference between the absolute value of the imaginary part of said frequency domain signal sample and the absolute value of the real part of said frequency domain signal sample to form a phase correction term; and a multiplier for multiplying said weighting factor with said phase correction term to form a phase compensation value;

a second adder summing said differential phase output and said phase compensation value to obtain a phase corrected discriminator output;

a low pass filter coupled to said second adder; and a voltage controlled oscillator coupled to said low pass filter.

* * * * *